(12) United States Patent
Jain

(10) Patent No.: US 6,487,107 B1
(45) Date of Patent: Nov. 26, 2002

(54) RETENTION TIME OF MEMORY CELLS BY REDUCING LEAKAGE CURRENT

(75) Inventor: Raj Kumar Jain, Diamond Tower (SG)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/855,165

(22) Filed: May 14, 2001

Related U.S. Application Data

(63) Continuation-in-part of application No. 09/615,987, filed on Jul. 14, 2000, now Pat. No. 6,304,478, and a continuation-in-part of application No. PCT/DE99/03133, filed on Sep. 29, 1999, and a continuation-in-part of application No. PCT/DE99/03151, filed on Sep. 30, 1999.

(51) Int. Cl.$^7$ .............................................. G11C 11/40

(52) U.S. Cl. .................................. 365/154; 365/230.05
(58) Field of Search ................................. 365/104, 154, 365/155, 156, 230.05

(56) References Cited

U.S. PATENT DOCUMENTS

| 5,684,735 A | * | 11/1997 | Kim ............................ 365/154 |
| 5,907,502 A | * | 5/1999 | Kim ............................ 365/156 |
| 6,028,787 A | * | 2/2000 | Sansbury et al. ........... 365/154 |

* cited by examiner

Primary Examiner—Tan T. Nguyen
(74) Attorney, Agent, or Firm—Dexter Chin

(57) ABSTRACT

A memory cell having first and second access transistors coupled to a storage transistor is disclosed. During a write 0 operation, a degraded logic 0 is written into the memory cell. By storing a degraded logic 0, the leakage current is reduced.

19 Claims, 2 Drawing Sheets

RETENTION TIME OF MEMORY CELLS BY REDUCING LEAKAGE CURRENT

This is a continuation-in-part of patent applications, titled:"Dual-Port Memory Cell", U.S. Ser. No. PCT/DE99/03151, Sep. 30, 1999 "Single-Port Memory Cell", U.S. Ser. No. PCT/DE99/03133, Sep. 29, 1999 and "Layout for a SemiConductor Memory", U.S. Ser. No. 09/615,987, now U.S. Pat. No. 6,304,478.

FIELD OF THE INVENTION

The present invention relates generally to integrated circuits. More particularly, the invention relates to reducing leakage current in integrated circuits.

BACKGROUND OF THE INVENTION

Integrated circuits (ICs) such as digital signal processors (DSPs) include on-chip memory to store information. The on-chip memory typically comprises, for example, an array of static random access memory (SRAM) cells connected by word lines in one direction and bit lines in another direction. The information stored in the SRAM cells are maintained until power is removed from the IC. Sense amplifiers are coupled to the bit lines to facilitate memory accesses, such as reads or writes. A sense amplifier is coupled to a pair of bit lines and senses a differential voltage indicative of the information stored in the selected memory cell on the bit line pair.

FIG. 1 shows a conventional SRAM cell 101. The SRAM cell comprises first and second transistors 110 and 120 coupled to a latch 130, which stores a bit of information. One transistor is coupled to a bit line 140 and the other is coupled to a bit line complement 141 while the gates are coupled to a word line 135. The latch includes first and second inverters 133 and 134, each implemented with two transistors. As such, the SRAM cell is realized using six transistors.

Smaller SRAM cells using less than six transistors have been proposed to reduce chip size. However, the charge stored in such cells dissipates overtime. In order to restore the information stored in the cell, a refresh operation is required. Typically, refreshing of memory cells interrupt the normal operation, adversely impacting performance.

As evidenced from the above discussion, it is desirable to provide a memory cell with reduced leakage current in order to improve retention time.

SUMMARY OF THE INVENTION

The present invention relates generally to memory cells. More particularly, the invention relates to improving retention time in memory cells. In one embodiment, the memory cell comprises first and second access transistors coupled to respective first and second terminals of a storage transistor. Bit lines are coupled to first terminals of the access transistors and word lines are coupled to the gates of the access transistors. In one embodiment, a degraded logic 0 is written to the memory cell during a write 0, causing the memory cell to store a degraded logic 0. Storing a degraded logic 0 in the memory cell reduces leakage current.

PREFERRED EMBODIMENTS OF THE INVENTION

Figure 1:
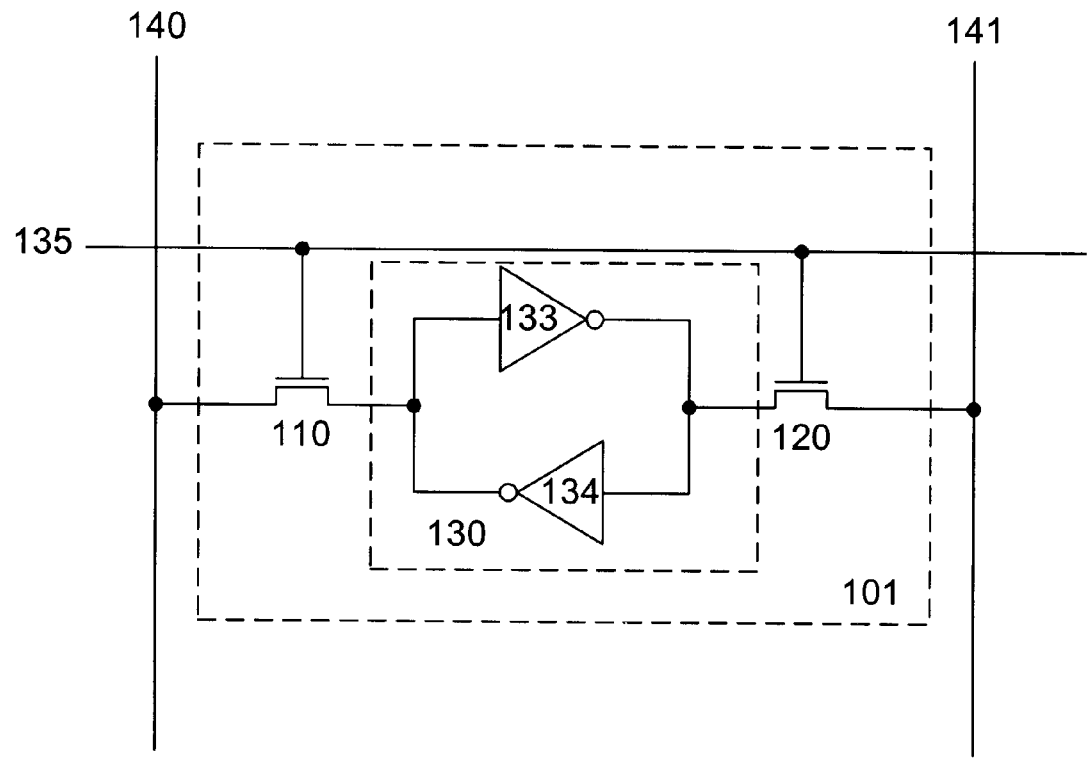
FIG. 1 shows a conventional SRAM cell.
Figure 2:
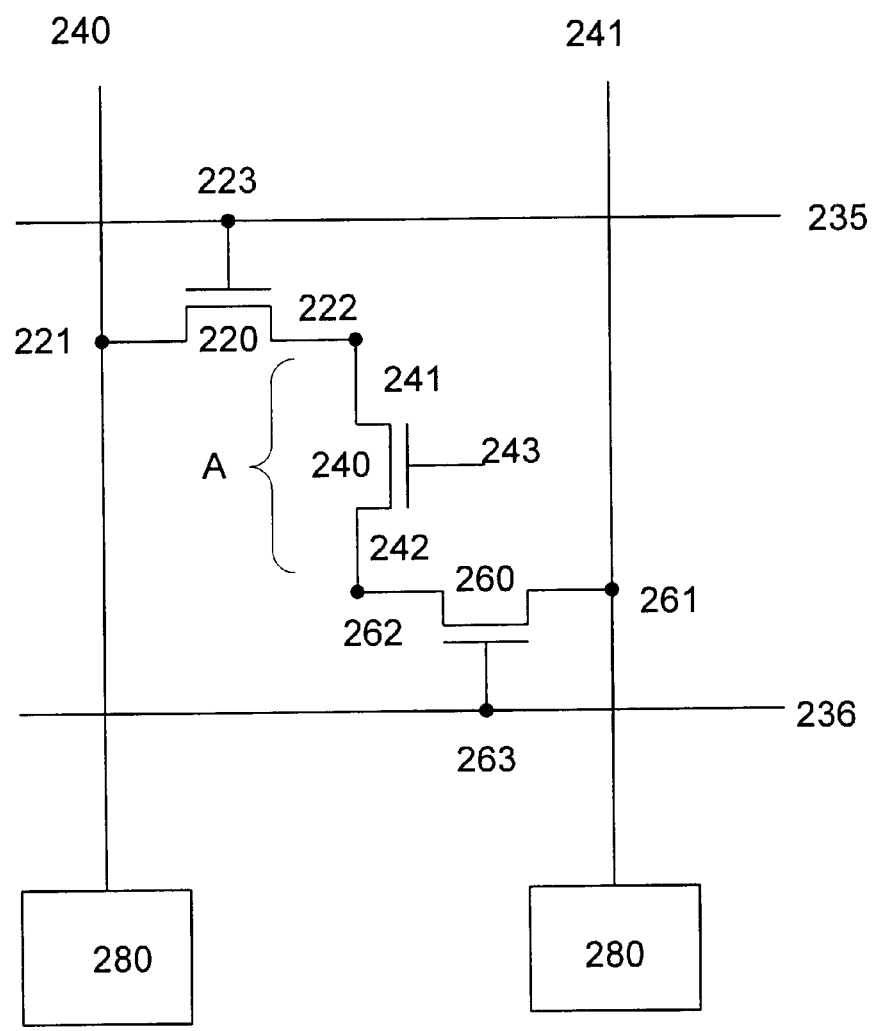
FIG. 2 shows a memory cell in accordance with one embodiment of the invention.

FIG. 2 shows a memory cell 201 in accordance with one embodiment of the invention. The memory cell comprises first and second access transistors 220 and 260 coupled in series to a storage transistor 240. The transistors, in one embodiment, comprise n-FETs. The memory cell can also be implemented with p-FETs or a combination of n and p-FETs.

The access transistors can serve as memory access ports, each coupled to a bit line (240 or 241) and a word line (235 or 236). In one embodiment, the first access transistor's first terminal 221 is coupled to the. bit line 240 and its gate is coupled to the word line 235. Similarly, the second access transistor's first terminal 261 is coupled to bit line 241 and its gate is coupled to word line 236. The memory cell can be accessed either through the first or second port. Refreshing of the memory cell can also be performed through the access ports.

Second terminals 222 and 262 of the access transistors are coupled respectively to first and second terminals 241 and 242 of the storage transistor. A gate 243 of the storage transistor is coupled to an active signal to render the transistor conductive. In one embodiment, the storage transistor is an n-FET with its gate coupled to an active signal. In one embodiment, the active signal comprises $V_{DD}$. As such, when power is applied to the IC, the storage transistor is rendered conductive to couple the first and second terminals together to form node A. When power is removed from the IC, the first and second terminals are isolated from each other.

A memory access from the first port is performed by activating the word line 235 (e.g., logic 1) to render the first access transistor conductive. As a result, node A is coupled to the bit line via the first access transistor's first terminal 221. The charge stored at node A is transferred to the bit line for a read access or the charge on the bit line is transferred to node A for a write access by write circuitry. Accessing the second port of the memory cell is achieved by selecting the word line 236 to couple node A to the bit line 241. A refresh can be performed in the first or second port by activating the first or second word line.

In another embodiment, the first port of the memory cell serves as an access port and the second port of the memory cell serves as a dedicated refresh port from which refreshes are performed. The first port is coupled to a bit line and a word line while the refresh port is coupled to a refresh bit line and a refresh word line. The operation of such a memory cell is described in concurrently filed patent application "Memory Architecture with Refresh and Sense Amplifiers", USSN 09/855,147, (attorney docket number OOE 16984SG), which is herein incorporated by reference for all purposes.

In accordance with the invention, write circuitry 280 coupled to the bit lines, is designed to write a degraded logic 0 into the memory cell during a write zero operation. In one embodiment, the degraded logic 0 is greater than $V_{SS}$ (0V). The degraded logic 0 is equal to $V_{SS}+V_d$, where $V_d$ is greater than 0V and less than gate threshold voltage of the access transistor. In one embodiment $V_d$ is from 0.1–0.4V. By writing a degraded logic 0 into the memory cell, the gate to source voltage of the access transistors is reduced. This reduces the leakage current through the channels of the access transistors, thereby improving the cells retention time as well as reducing power consumption.

The memory cell is fabricated on a substrate using conventional techniques. Various cell arrangements or layouts, such as those described in, for example, parent patent application, titled: "Layout for a SemiConductor Memory", U.S. Ser. No. 09/615,987 and which is herein incorporated by reference for all purposes, are also useful.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A memory cell comprising:
   first and second access transistors, each with a gate and first and second terminals
   first and second bit lines, the first bit line coupled to the first terminal of the first access transistor and the second bit line coupled to a first terminal of the second transistor;
   first and second word lines, the first word line coupled to the first access transistor and the second word line coupled to the second access transistor;
   a storage transistor having a gate and first and second terminals, the first and second terminals respectively coupled to the second terminals of the first and second access transistors; and
   sense amplifiers coupled to the first and second bit lines, the sense amplifier, during a write logic 0 operation, causes a degraded logic 0 to be stored in the storage transistor.

2. The memory cell of claim 1 wherein the first access transistor serves as a first access port.

3. The memory cell of claim 2 wherein the second access transistor serves as a second access port.

4. The memory cell of claim 3 wherein the first word line is coupled to the gate of the first access transistor.

5. The memory cell of claim 4 wherein the second word line is coupled to the gate of the second access transistor.

6. The memory cell of claim 5 wherein the degreded logic 0 is greater than $V_{ss}$.

7. The memory cell of claim 6 wherein the degraded logic 0 is equal to $(V_{ss}+V_d)$.

8. The memory cell of claim 7 wherein $V_d$ is greater than 0V and less than a gate threshold voltage of the access transistor.

9. The memory cell of claim 8 wherein $V_d$ is from 0.1V to 0.4V.

10. The memory cell of claim 2 wherein the second access transistor serves as a refresh port.

11. The memory cell of claim 10 wherein the refresh port is coupled to a refresh bit line and a refresh word line.

12. The memory cell of claim 11 wherein the degraded logic 0 is greater than $V_{ss}$.

13. The memory cell of claim 12 wherein the degraded logic 0 is equal to $(V_{ss}+V_d)$.

14. The memory cell of claim 13 wherein $V_d$ is greater than 0V and less than a gate threshold voltage of the access transistor.

15. The memory cell of claim 14 wherein $V_d$ is from 0.1V to 0.4V.

16. The memory cell of claim 1 wherein the degraded logic 0 is greater than $V_{ss}$.

17. The memory cell of claim 16 wherein the degradabe logic 0 is equal to $(V_{ss}+V_d)$.

18. The memory cell of claim 17 wherein $V_d$ is greater than 0V and less than a gate threshold voltage of the access transistor.

19. The memory cell of claim 18 wherein $V_d$ is from 0.1V to 0.4V.

* * * * *